United States Patent

Wong et al.

[11] Patent Number: 5,943,379
[45] Date of Patent: Aug. 24, 1999

[54] MULTI-PHASE TRAPEZOIDAL WAVE SYNTHESIZER USED IN PHASE-TO-FREQUENCY CONVERTER

[75] Inventors: Hee Wong, San Jose; Gabriel Ming-Yu Li, San Francisco, both of Calif.

[73] Assignee: National Semiconductor Corporation, Santa Clara, Calif.

[21] Appl. No.: 08/873,118

[22] Filed: Jun. 11, 1997

[51] Int. Cl.[6] .............................. H03D 3/24; H04L 25/36; H04L 25/40; H04L 7/00
[52] U.S. Cl. .......................... 375/374; 375/371; 375/373; 375/375; 327/156; 327/160
[58] Field of Search ..................... 375/374, 373, 375/371, 375, 376, 344, 327; 327/156, 160

[56] References Cited

U.S. PATENT DOCUMENTS

| | | | |
|---|---|---|---|
| 4,376,268 | 3/1983 | Moriya et al. | 331/10 |
| 5,056,054 | 10/1991 | Wong et al. | 364/724.01 |
| 5,224,125 | 6/1993 | Wong et al. | 375/328 |
| 5,351,275 | 9/1994 | Wong et al. | 375/376 |
| 5,646,967 | 7/1997 | Hee et al. | 375/373 |
| 5,651,036 | 7/1997 | Hee et al. | 375/374 |

*Primary Examiner*—Stephen Chin
*Assistant Examiner*—Michael W. Maddox
*Attorney, Agent, or Firm*—Limbach & Limbach LLP

[57] ABSTRACT

A trapezoidal waveform synthesizer converts a digital phase error signal into a plurality of phase-separated trapezoidal analog waveforms. The trapezoidal waveform synthesizer includes an up/down counter that counts the positive and negative phase errors and generates a multi-bit, parallel digital counter output signal that indicates a cumulative current value of the phase errors. The counter output signal includes a least significant bit (LSB) portion and a most significant bit (MSB) portion. An upper PDM circuit converts the MSB portion of the output signal counter and a portion of the LSB portion of the counter output signal to a plurality of sets of serially-weighted multi-bit output signals. A lower PDM circuit converts the MSB and LSB portions of the counter output signal to a plurality of serially-weighted single-bit output signals. Each of the sets of multi-bit outputs and a corresponding one of the single-bit outputs are provided to an RC circuit that converts the digital signal to an analog voltage such that the waveform synthesizer provides a plurality of phase-separated trapezoidal waveforms.

4 Claims, 8 Drawing Sheets

MULTI-PHASE TRAPEZOIDAL WAVE SYNTHESIZER USED IN PHASE-TO-FREQUENCY CONVERTER

BACKGROUND OF THE INVENTION

1. Field of the Invention

The present invention relates to very high frequency phase locked loops (PLL) and, in particular, to a wave synthesizer that creates multiple-phase trapezoidal waveforms that drive the PLL's frequency controlled oscillator, resulting in a PLL with greatly improved response.

2. Discussion of the Related Art

Commonly-assigned U.S. Pat. No. 5,224,125, issued Jun. 29, 1993, discloses a signed phase-to-frequency (P-to-F) converter for use in a very high frequency PLL. Referring to FIG. 1, the quasi-digital, high frequency PLL 10 disclosed in the '125 patent includes a phase detector 12, a signed P-to-F converter 14, a 3-phase ring oscillator 16 and a frequency controlled oscillator (FCO) 18. FCO 18 and P-to-F converter 14 allow the use of a clock frequency which is no higher than the generating frequency of the PLL 10 to achieve acceptable phase resolution.

The P-to-F converter 14 converts the phase error information generated by the phase detector 12, which is in the form of UP, DOWN and HOLD signals, to multi-phase analog waveforms (PHASE 1, PHASE 2, PHASE 3) that can be used to drive the FCO 18. The output frequency of the P-to-F converter 14 determines the locking range of the PLL 10. The phase error direction, either plus or minus, is represented by the phase relationship, either leading or lagging, of the multi-phase outputs of the P-to-F converter 14, which the FCO 18 interprets as either an increase, a decrease or no change in the operating frequency.

As shown in FIG. 2, the P-to-F converter 14 disclosed in the '125 patent includes a counting circuit 21 that converts the plus/minus phase error signal UD_PI provided by the phase detector 12 to a 7-bit count signal. The three most significant bits (MSB) of the count signal, i.e., the HI_CNT signal, are used by a 3-phase waveform generator 25 to generate a 3-phase sawtooth pattern. The four least significant bits (LSB) of the count signal, i.e., the LO_CNT signal, are utilized by a pulse density modulation (PDM) circuit 28 to generate a signal that indicates the binary weight of the LSB part of the count. The output of the LSB PDM circuit 28 and the 3-phase sawtooth pattern are applied to three MSB PDM circuits 36, 38, 40. The three carry outputs of the MSB PDM circuits 36, 38, 40 are the digital outputs of the P-to-F converter 14. Following buffering, the three digital outputs of the P-to-F converter 14 are converted to analog signals (PHASE 1, PHASE 2, PHASE 3) by RC filters. The plus/minus phase is indicated by the leading/lagging phase relationship among the output waveforms.

A problem associated with the solution disclosed in the '125 patent is real time delay. That is, since generation of the 3-phase triangular waveform is within the PLL tracking loop, the time required for synthesis directly impacts upon the response time of the phase error correction, which increases the phase jitter of the recovered clock.

U.S. Pat. No. 5,224,125 is hereby incorporated by reference in its entirety.

Commonly-assigned U.S. patent application Ser. No. 08/644,035, filed on May 9, 1996, by Wong Hee and Gabriel Li, now U.S. Pat. No. 5,646,967 provides an improvement over the PLL system disclosed in the '125 patent.

Referring to FIG. 3, U.S. Pat. No. 5,646,967 discloses a triangular waveform synthesizer 100 for a phase-to-frequency converter that generates a multi-phase triangular waveform using both Pulse Density Modulation (PDM) and a DC modulation scheme. The lower counter 102, upper counter 104 and lower PDM circuit 106 are similar to those utilized in the FIG. 2 waveform synthesizer. However, to minimize both delay and logic, while continuing to provide reasonable resolution, a 4-bit upper PDM circuit 112 and associated logic generates the PDM output waveform with polarity information and two switching waveforms that encode the DC level information to provide a resultant sum. The resulting waveform, after filtering, is the triangular waveform. Since the switching and adding of the DC levels occur in real time, the actual delay for the resultant triangular wave is only that of the 4-bit PDM.

U.S. Pat. No. 5,646,967, is hereby incorporated by reference in its entirety.

The system disclosed in '967 patent improves upon the system disclosed in the '125 patent. Both systems take advantage of Pulse Density Modulation techniques. The key advantage of the system disclosed in the '967 patent over the system disclosed in the '125 patent is its simplicity and short real time delay, which, as stated above, is a major factor in reducing the output jitter of the PLL.

A problem with the system disclosed in the '967 patent, however, is the relatively high energy of the third and higher harmonics of the triangular wave.

Commonly-assigned U.S. patent application Ser. No. 08/644,036, filed May 9, 1996, now U.S. Pat. No. 5,651,036, provides an improvement over both of the above-described systems.

Referring to FIG. 4, U.S. Pat. No. 5,651,036 discloses a phase-to-frequency converter 200 that utilizes a triangular waveform synthesizer to generate a multi-phase triangular waveform using both Pulse Density Modulation (PDM) and a DC modulation scheme. The lower counter 202, upper counter 204, lower PDM circuit 206 and upper PDM circuit 208 are similar to those utilized in the FIG. 3 triangular waveform synthesizer. That is, a PDM and associated logic generates both the multi-phase PDM output waveform with polarity information and two switching waveforms that encode the DC level information to provide a resultant sum. The resulting waveform, after filtering, is the triangular waveform. However, as shown in FIG. 4, a wave modifier 210 modifies each triangular waveform by reducing the ramp rate at appropriate positions to suppress the third harmonic and its multiples. The ramp rate is proportional to the output of the Pulse Density Modulator. The rate of the PDM output is reduced by gating the output by the wave synthesizer clock signal, thereby reducing the density of the output by one half in the appropriate positions.

U.S. Pat. No. 5,651,036 is hereby incorporated by reference in its entirety.

Although the '036 patent discloses a PLL that substantially improves over the prior art, the response time of the PLL can still be improved.

SUMMARY OF THE INVENTION

The present invention provides a trapezoidal waveform synthesizer that converts a digital phase error signal into a plurality of phase-separated trapezoidal analog waveforms. The trapezoidal waveform synthesizer includes an up/down counter that counts the positive and negative phase errors and generates a multi-bit, parallel digital counter output signal that indicates a cumulative current value of the phase errors. The counter output signal includes a least significant bit (LSB) portion and a most significant bit (MSB) portion.

An upper PDM circuit converts the MSB portion of the counter output signal and a portion of the LSB portion of the counter output signal to a plurality of sets of serially-weighted multi-bit output signals. A lower PDM circuit converts the MSB and LSB portions of the counter output signal to a plurality of serially-weighted single-bit output signals. Each one of the sets of multi-bit outputs and a corresponding one of the single-bit outputs are provided to an RC circuit that converts the digital signal to an analog voltage. The waveform synthesizer thereby provides a plurality of phase-separated trapezoidal waveforms.

These and other features and advantages of the present invention will be better understood and appreciated upon consideration of the following detailed description and the accompanying drawings which set forth an illustrative embodiment in which the principles of the invention are utilized.

DETAILED DESCRIPTION OF THE INVENTION

Figure 1:
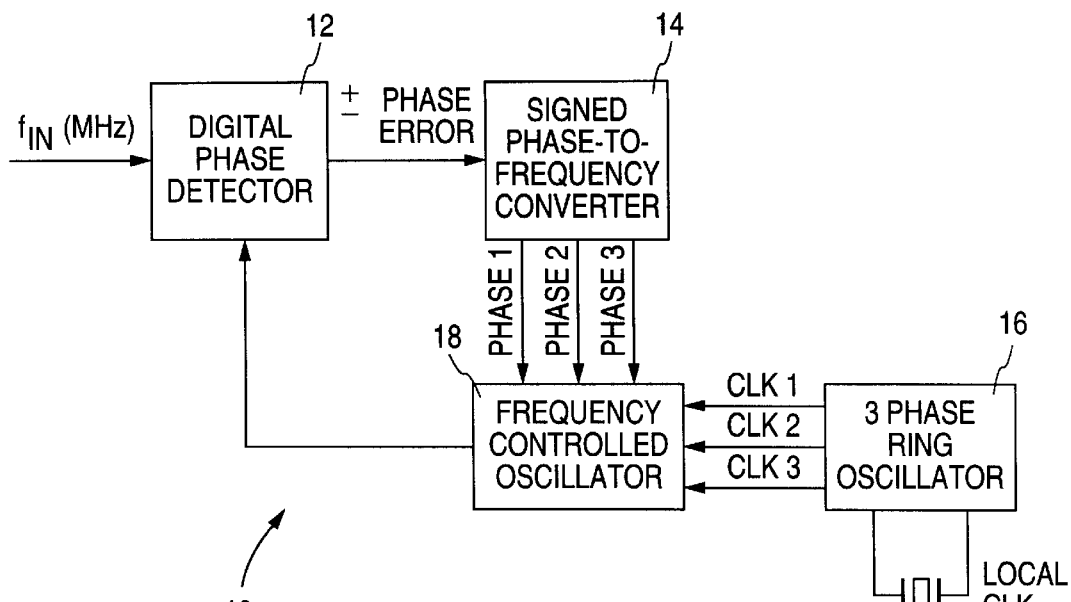
FIG. 1 is a block diagram illustrating a known digital phase locked loop.
Figure 5:
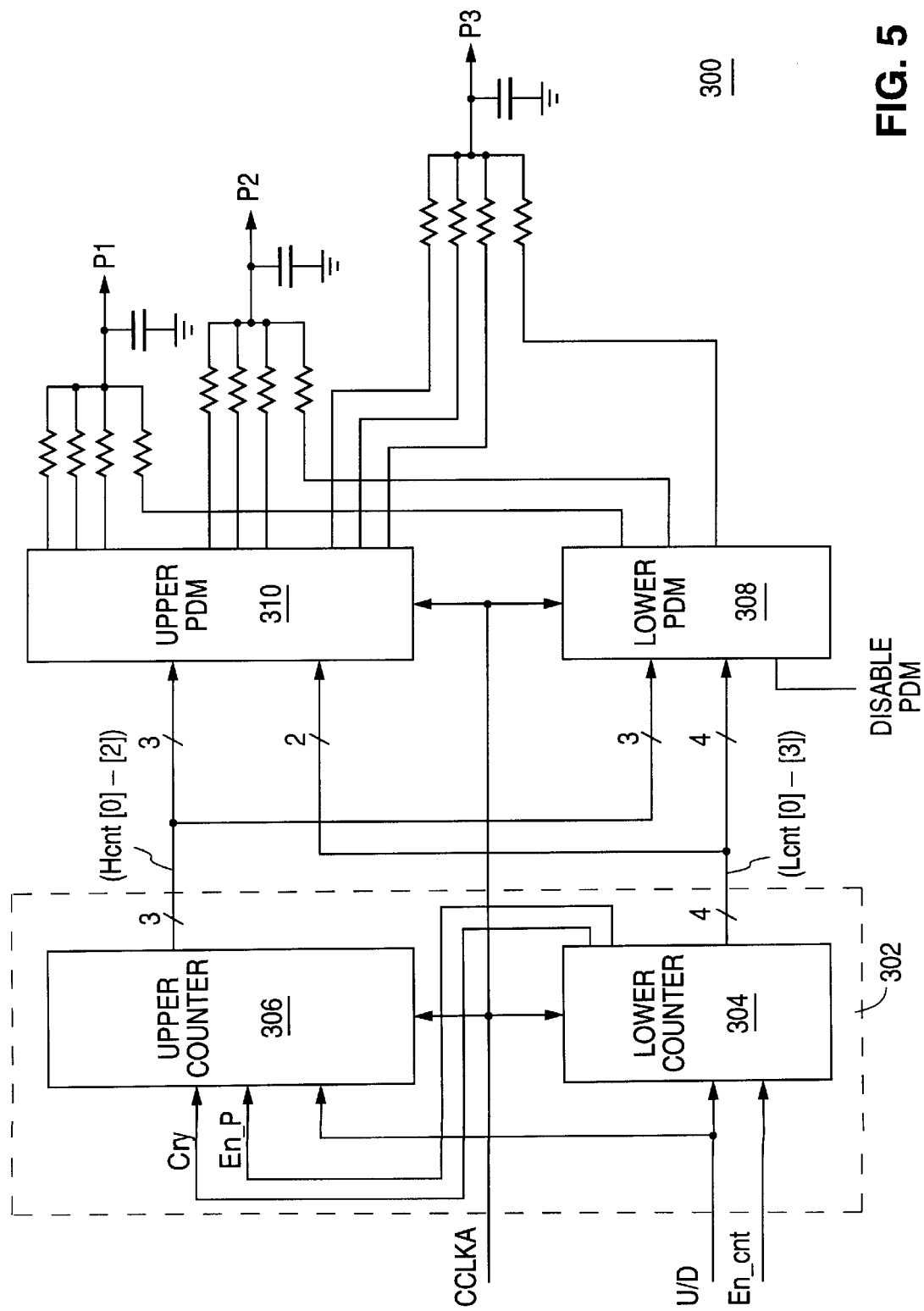
FIG. 5 is a block diagram illustrating a multi-phase trapezoidal waveform synthesizer, in accordance with the present invention, that may be utilized in the FIG. 1 PLL.

FIG. 5 shows a block diagram of a 3-phase trapezoidal waveform synthesizer 300 in accordance with the present invention. The trapezoidal waveform synthesizer 300 can be used to replace the P-to-F converter 14 in the FIG. 1 PLL circuit 10 described in the '125 Wong et al. patent.

As shown in FIG. 5, the trapezoidal waveform synthesizer 300 receives two signals, an up/down signal U/D that represents the +/− phase error quantities generated by the digital phase detector 12 (FIG. 1) and a count enable signal En_cnt. Input signal U/D controls the count direction of an up/down counter 302, causing the counter 302 to count up when U/D=logic "1" and to count down when U/D=logic "0". The count enable signal En_cnt enables the counter 302 when in logic "1" and stops the counter 302 when in logic "0". Clock signal CCLKA is derived from the output of a 3-phase ring oscillator 16 (see FIG. 1).

Counter 302 may be a conventional up/down counter viewed as a lower 4-bit LSB binary up/down counter 304 and an upper 3-bit MSB binary up/down counter 306. The lower 4-bit counter 304 receives both the phase error signal U/D and the enable signal En_cnt. Thus, lower counter 304 stops if En_cnt=0. The carry output signal Cry of the 4-bit lower counter 304 and a carry enable signal En_P are fed into the upper 3-bit counter 306 that counts from 0 to 5.

The lower counter 304 generates a four-bit LSB output (Lcnt[0]–[3]) that is provided to a lower PDM circuit 308. Bits [2] and [3] of the LSB output are provided to an upper PDM circuit 310. The upper counter 306 generates a three-bit MSB output (Hcnt[0]–[2]), representing count 0–5, that is provided to the lower PDM circuit 308 and to the upper PDM circuit 310.

As further shown in FIG. 5, the upper PDM circuit 310 generates three sets of 3-bit serially weighted outputs, each of which is combined with a corresponding one of three single-bit outputs from the lower PDM circuit 308. The three sets of 4-bit serially weighted outputs are then converted from digital to analog signals by RC circuits to provide three trapezoidal waveform outputs P1, P2, P3 that are phase aligned 120 degrees apart.

More detail regarding the implementation of the lower counter 302 and the upper counter 306 is provided in file ptf_lcnt.c and file ptf_hcnt.c, respectively, of attached Appendix A, which is an integral part of this patent specification.

A description of the logic implementation of the lower PDM circuit 308 and of the upper PDM circuit 310 is provided below. For an actual implementation of these two functions, reference is made to the gal equations provided in file ptf_ldac.c and file ptf_hdac.c, respectively, in attached Appendix A.

FIGS. 6–9 show an embodiment of the lower PDM circuit 308 and the upper PDM circuit 310 in greater detail.

Figure 6:
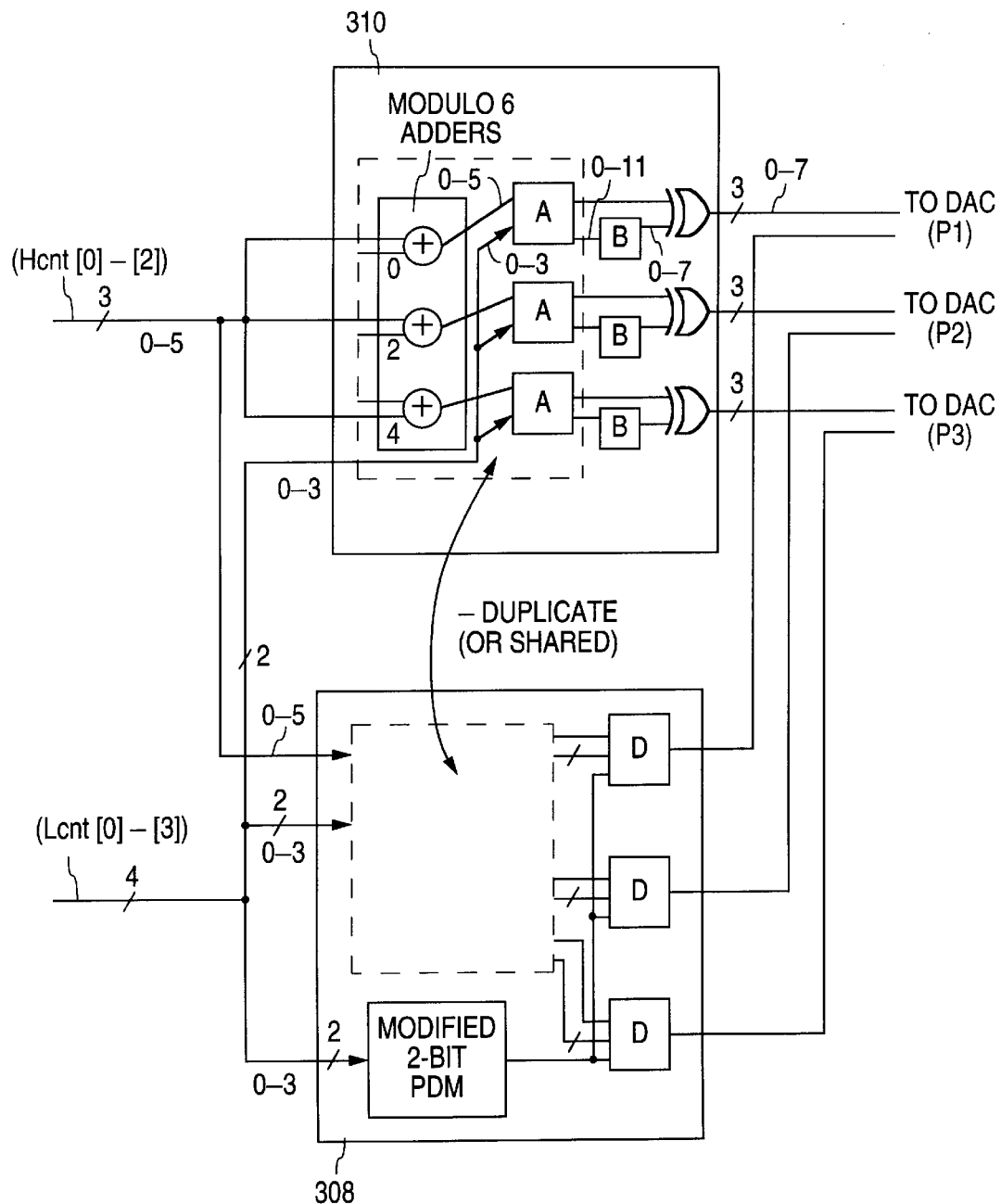
FIG. 6 is a block diagram illustrating a more detailed embodiment of the FIG. 5 multi-phase trapezoidal waveform synthesizer.
Figure 7:
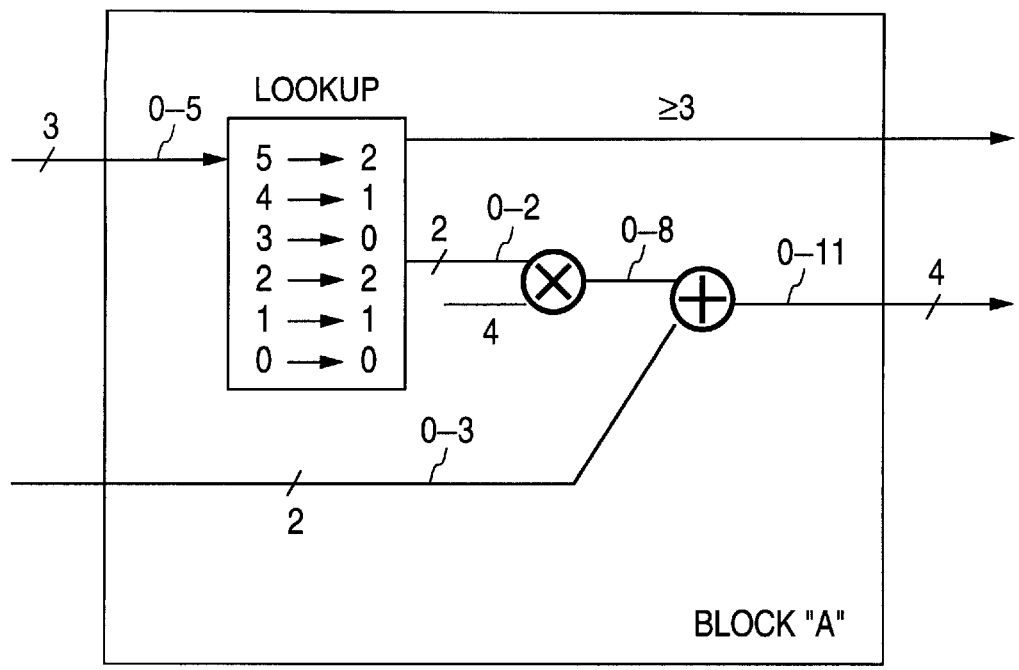
FIG. 7 is a block diagram illustrating a more detailed embodiment of block A in FIG. 6.
Figure 8:
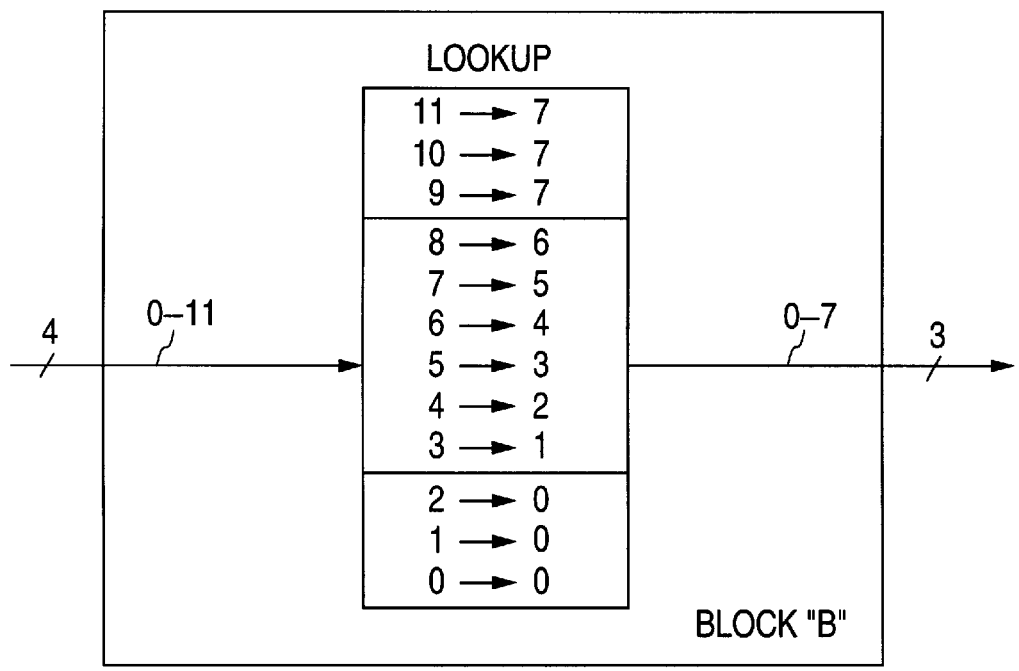
FIG. 8 is a block diagram illustrating a more detailed embodiment of block B in Fig, 6.

As shown in FIG. 6, the 3-bit count (Hcnt[0]–[2]) provided by the upper counter 306, which represents a count of 0–5, is provided to modulo 6 adders of the upper PDM circuit 310. Each of the modulo 6 adders provides its output, also representing a 0–5 count, to a lookup table in Block A (see FIG. 7).

The output of the look up table is provided to a 4× multiplier, the output of which represents count 0–8. The multiplier output is added with the 2-bit output from the lower counter, which represents count 0–3, the 4-bit adder output thus representing count 0–11. The adder output drives a second look up table in Block B (see FIG. 8) which converts the 0–11 count to a 3-bit output representing count 0–7.

As further shown in FIG. 6, the modulo 6 adders and Block A circuitry of the upper PDM circuit 310 are duplicated in (or, alternatively, shared by) the lower PDM circuit 308. Thus, the 3-bit count (0–5) provided by the upper counter 306 is provided to the modulo 6 adders of the lower PDM circuit 308. Each of these modulo 6 adders provides its output, also representing a 0–5 count, to the Block A look up table (see FIG. 7). The output of the Block A lock up table is provided to a 4× multiplier. The multiplier output, representing count 0–8, is added with the 2-bit (count 0–3) output from the lower counter 304. As further shown in FIG. 6, the 4-bit output of the adder in the lower PDM circuit and the greater than or equal to 3 indicator bit are provided to the Block D circuit (see FIG. 9).

Figure 10:
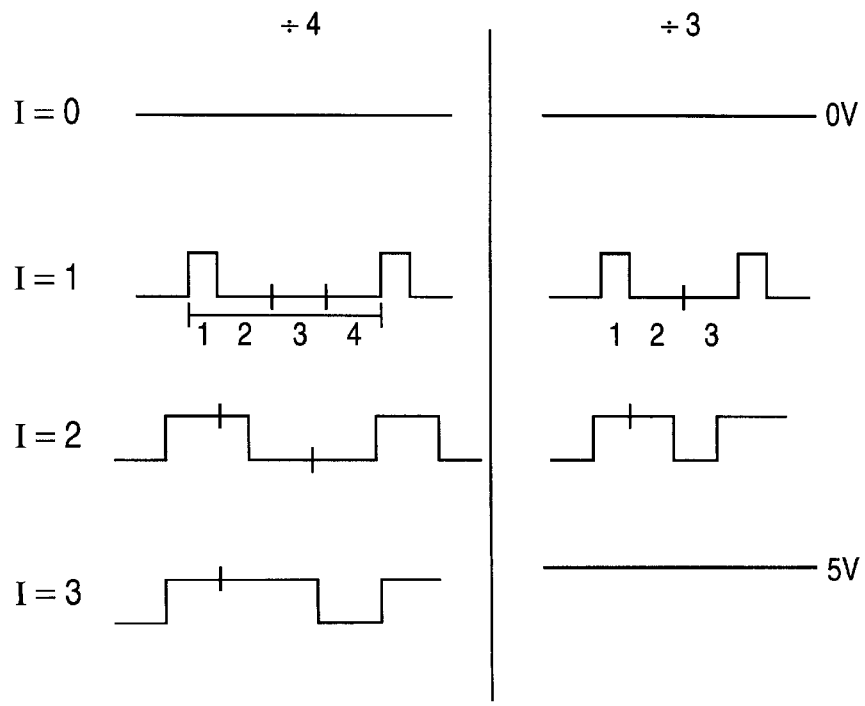
FIG. 10 shows modified 2-bit PDM as utilized in the FIG. 6 multi-phase trapezoidal waveform synthesizer.
Figure 2:
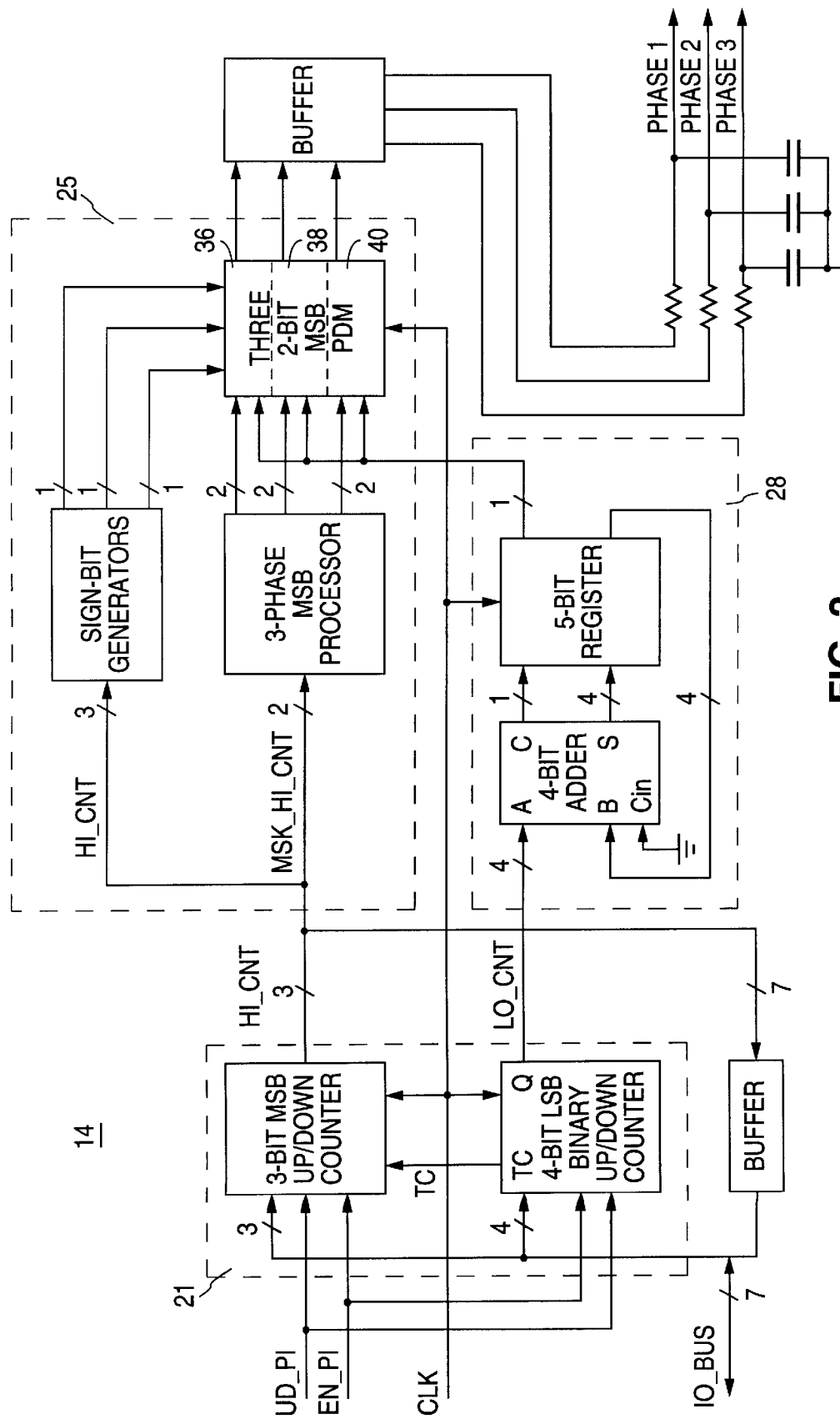
FIG. 2 is a block diagram illustrating a phase-to-frequency converter disclosed in U.S. Pat. No. 5,224,125 and that may be utilized in the FIG. 1 PLL.
Figure 3:
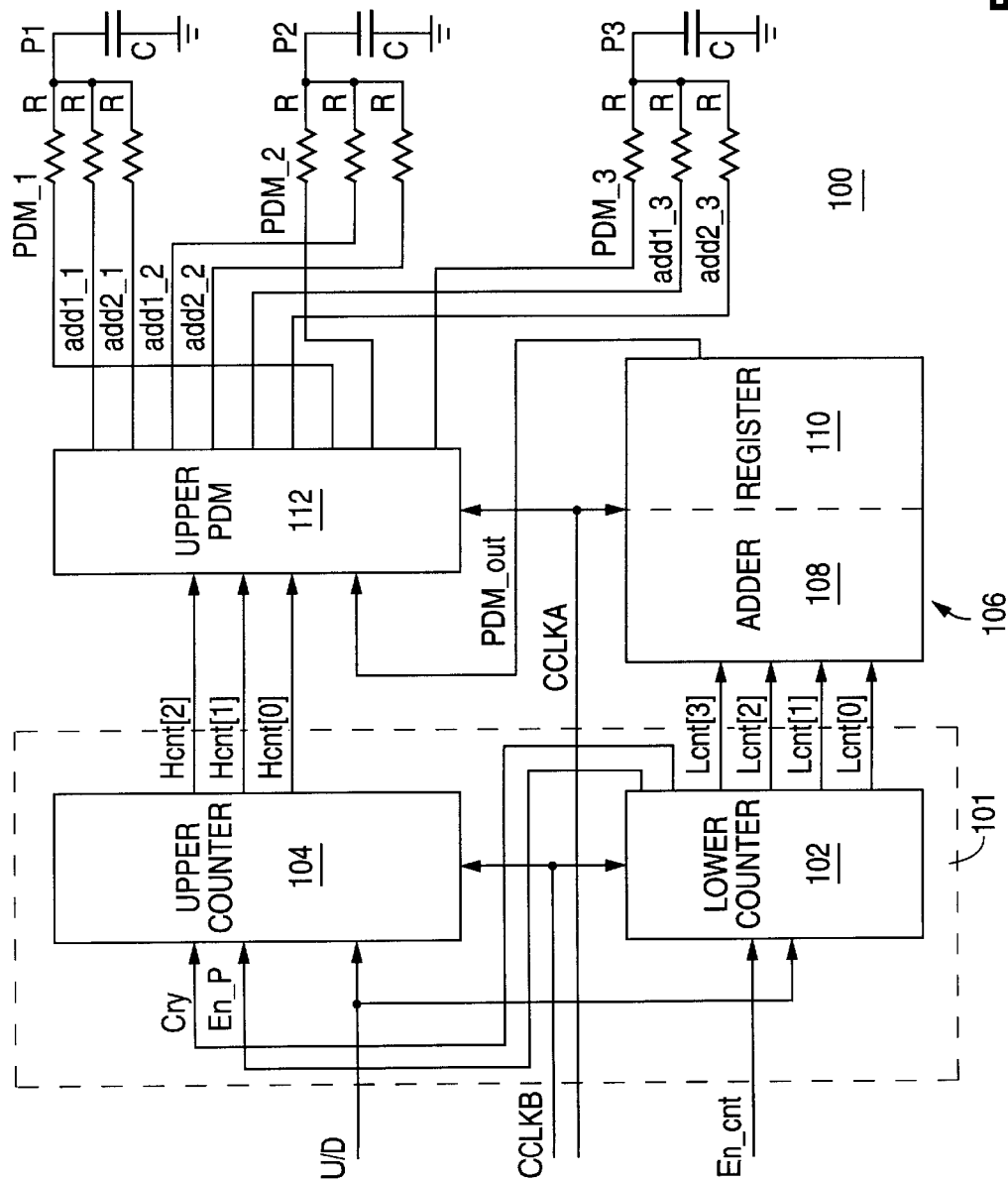
FIG. 3 is a block diagram illustrating a three-phase triangular wave synthesizer disclosed in U.S. Pat. No. 5,646,967 and that may be utilized in the FIG. 1 PLL.
Figure 4:
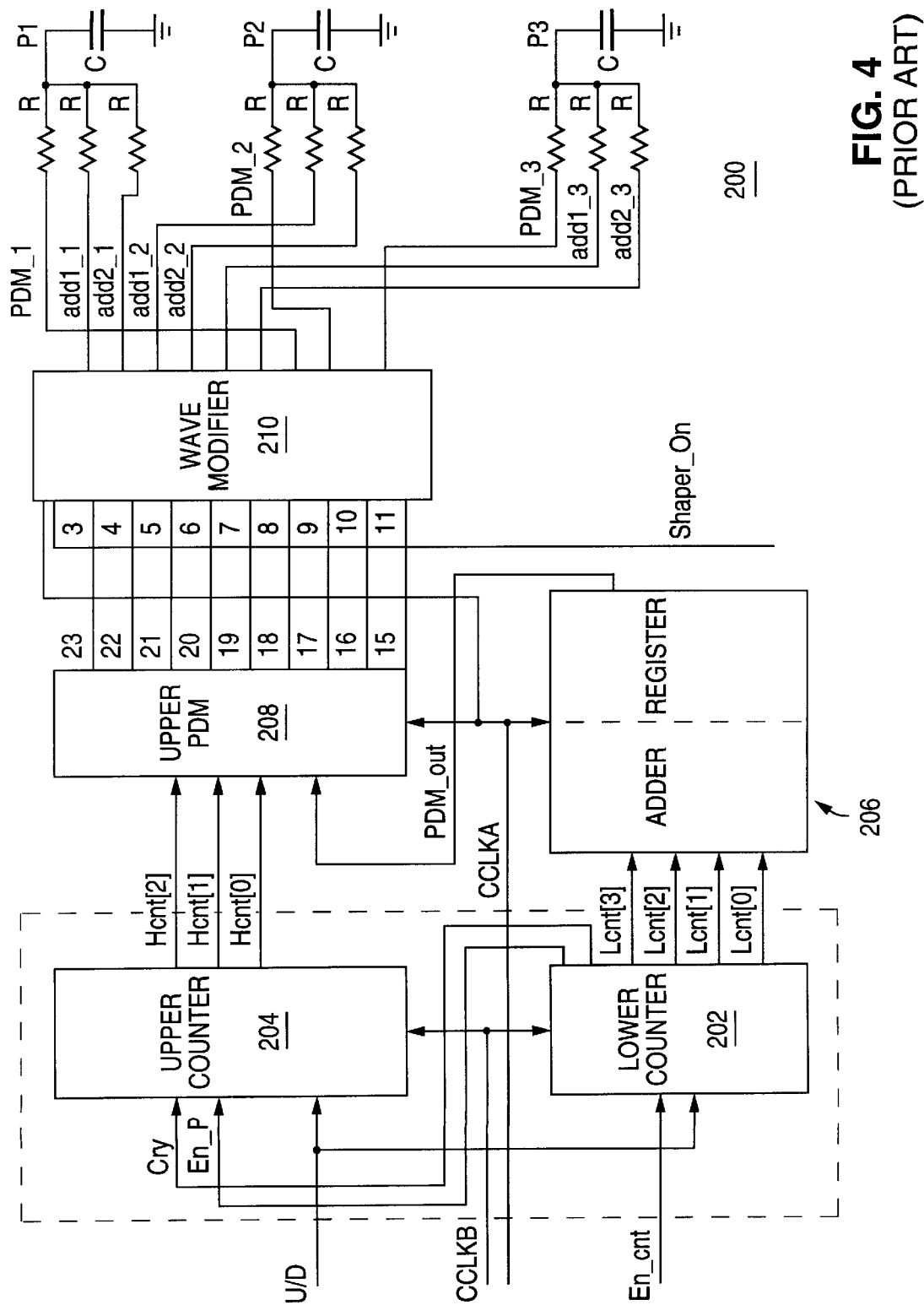
FIG. 4 is a block diagram illustrating a three-phase waveform synthesizer with third harmonic suppression disclosed in U.S. Pat. No. 5,651,036 and that may be utilized in the FIG. 1 PLL.
Figure 9:
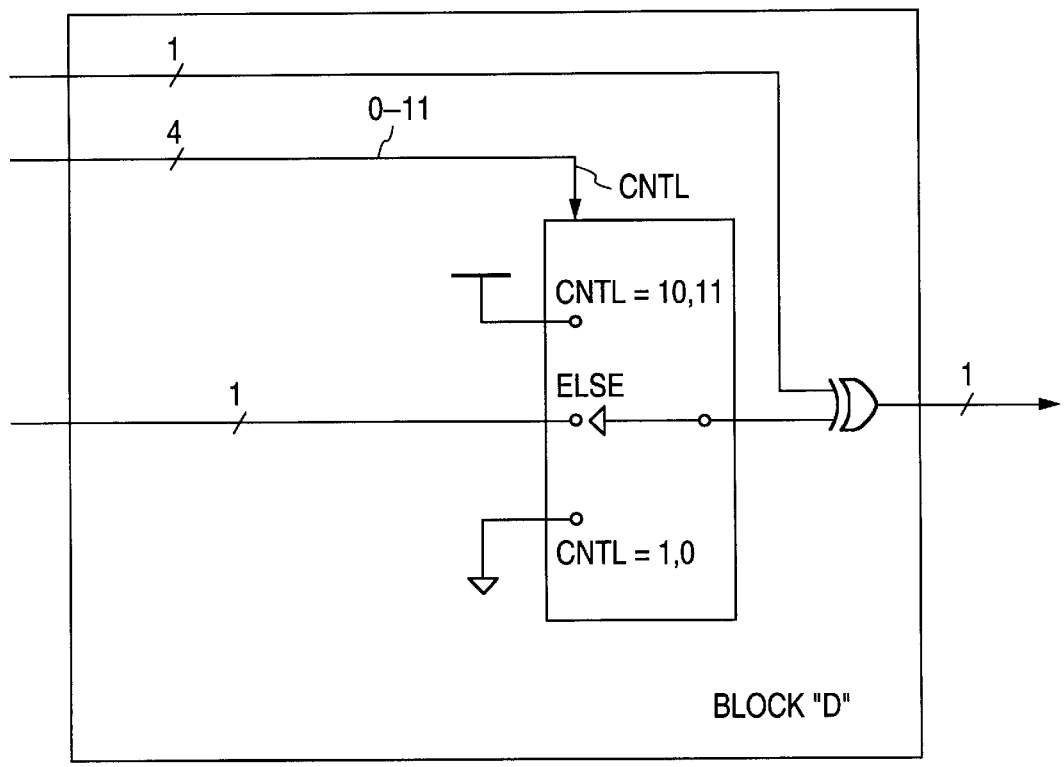
FIG. 9 is a block diagram illustrating a more detailed embodiment of block D in FIG. 6.

FIG. 6 also shows the 2-bit output of the lower counter 304 being provided to a modified 2-bit PDM. The modified 2-bit PDM operates as shown in FIG. 10. The single bit output of the modified 2-bit PDM is provided to each of the Block D circuits (FIG. 9) of the lower PDM circuit 308. Each Block D circuit generates a single bit output (as shown in FIG. 9) which is combined with a corresponding one of the sets of 3-bit outputs from the upper PDM circuit 310.

It should be understood that various alternatives to the embodiments of the invention described herein may be employed in practicing the invention. It is intended that the following claims define the scope of the invention and that structures and methods within the scope of these claims and their equivalents be covered thereby.

APPENDIX A

E:\xm\crm2\pal\patent\ptf_lcnt.c

```c
#include "romwcsc.h"

char *s[]={ "ev / ptf_lcnt",
          . "Pal=GAL22CV10-10L(Nat), Addbit=13, Datbit=10",
          . "rev 0 / Oct 12,1994",
          . "rev 0 / Oct 12,1994" };

/* eqnfile pin assignment: i)nput, r)egistered op, c)ombinatorial op
    {"  1   2   3   4   5   6   7   8   9  10  11  12 "}
    {"  ck  i9  i8  i7  i6  i5  i4  i3  i2  i1  i0  gnd "}
    {"  13  14  15  16  17  18  19  20  21  22  23  24 "}
    {"  /oe c0  c1  c2  c3  r4  r5  r6  r7  c8  c9  vcc "}
*/
/* eqnfile additional equations:
    c3.trst = oe
    c2.trst = oe
    c1.trst = oe
    c0.trst = oe
*/

UL  cf_carry_l,cf_locnt_h,cf_locnt_l,cf_tri_z_locnt;
UL  cf_tri_z_locnt_h,cf_tri_z_locnt_l,encnt,udown,load,reset;
UL  carry_h,carry_l,locnt_h,locnt_l,tri_z_locnt;

int  main(void);
void logic(void);
UL   bin_updwn_cntr(UL,UL,UL,UL,UL *);

UL   address,addrtop,rdata;
int  addb,datb;

/* main ******************************************************* FUNCTION */
int main()
{ time(&TIMESTAMP);
. hkeep(s[0],s[1],s[2],s[3],&addrtop,&addb,&datb);

. for (address=0; address<=addrtop; address++)
              /* address bits   "5432109876543210"  */
. { define_input_vector(address, "---1------------", &cf_carry_l       );
. . define_input_vector(address, "----11----------", &cf_locnt_h       );
. . define_input_vector(address, "------11--------", &cf_locnt_l       );
. . define_input_vector(address, "--------1111----", &cf_tri_z_locnt   );
. . define_input_vector(address, "--------11------", &cf_tri_z_locnt_h );
. . define_input_vector(address, "----------11----", &cf_tri_z_locnt_l );
. . define_input_vector(address, "------------1---", &encnt            );
. . define_input_vector(address, "-------------1--", &udown            );
. . define_input_vector(address, "--------------1-", &load             );
. . define_input_vector(address, "---------------1", &reset            );
. . logic(); rdata=(UL)0;
. .
. .           /*    data bits   "5432109876543210"  */
. . define_output_vector(&rdata, "------1---------", &carry_h          );
. . define_output_vector(&rdata, "-------1--------", &carry_l          );
. . define_output_vector(&rdata, "--------11------", &locnt_h          );
```

1                                                                  ptf_lcnt.c

```
E:\crm\crm2\pal\patent\ptf_lcnt.c

. . define_output_vector(&rdata, "------------11----", &locnt_l       );
. . define_output_vector(&rdata, "------------1111", &tri_z_locnt    );
. . store_rdata(address,rdata);
. }
. write_rdata_cleanup(); return(0);
}

/* logic ****************************************************** FUNCTION */
void logic()
{ UL cf_locnt;

. cf_locnt = (cf_locnt_h << 2) | cf_locnt_l; /* combine into a 4-bit val */
. tri_z_locnt = cf_locnt;                    /* output these bits */

. carry_h = 0;
. carry_l = 0;
. if ((cf_locnt   >= (UL)15)&&(udown==1)) { carry_h = 1; }
. if ((cf_locnt   == (UL)0 )&&(udown==0)) { carry_h = 1; }
. if ((cf_locnt_l >= (UL)3 )&&(udown==1)) { carry_l = 1; }
. if ((cf_locnt_l == (UL)0 )&&(udown==0)) { carry_l = 1; }

. locnt_h = cf_locnt_h;
. locnt_l = cf_locnt_l;
. bin_updwn_cntr(4,udown,encnt,cf_carry_l,&locnt_h);
. bin_updwn_cntr(4,udown,encnt,         1,&locnt_l);

. /* clear or load counter */
. if (load) {
. . carry_h = carry_l = 0;
. . locnt_h = cf_tri_z_locnt_h; /* read from input port */
. . locnt_l = cf_tri_z_locnt_l;

. } else if (reset) {
. . carry_h = carry_l = 0;
. . locnt_h = locnt_l = 0;
. }
. return;
}

/* bin_updwn_cntr ********************************************* FUNCTION */
UL bin_updwn_cntr(maxcntp1,up_down,en__P,en__T,  cQs)
UL maxcntp1,up_down,en__P,en__T, *cQs;
{ UL cnt_max,count,carry,over,under;

. cnt_max = maxcntp1 - 1;
. count   = *cQs;

. over  = (((count >= cnt_max)&&(up_down==1)) ? (1) : (0));
. under = (((count == 0)       &&(up_down==0)) ? (1) : (0));
. if (!en__T) {
. . carry=0;      /* en__T cuts off carry */
. } else {
```

```
E:\crm\crm2\pal\patent\ptf_lcnt.c

.  . carry = (over | under);
.  }
.
. if ((en__T)&&(en__P))
. { if (up_down) {    /* 1=up */
. . . *cQs = ((over) ?       (0) : (count+1));
. . } else {          /* 0=down */
. . . *cQs = ((under) ? (cnt_max) : (count-1));
. . }
. }
. return(carry);
}
```

3e                                                                   ptf_lcnt.c

E:\crm\crm2\pal\patent\ptf_hcnt.c

```c
#include "romwcsc.h"

char *s[]={ "ev / ptf_hcnt",
          . "Pal=GAL22CV10-10L(Nat), Addbit=14, Datbit=10",
          . "rev 0 / Oct 12,1994",
          . "rev 0 / Oct 12,1994" };

/* eqnfile pin assignment: i)nput, r)egistered op, c)ombinatorial op
    {"   1    2    3    4    5    6    7    8    9   10   11   12 "}
    {"  ck   i9   i8   i7   i6   i5   i4   i3   i2   i1   i0  gnd "}
    {"  13   14   15   16   17   18   19   20   21   22   23   24 "}
    {" /oe   c0   c1   c2   c3   r4   r5   r6   c7   c8   c9  vcc "}
*/
/* eqnfile additional equations:
    c3.trst = oe
    c2.trst = oe
    c1.trst = oe
    c0.trst = oe
*/

UL  cf_hicnt,cf_tri_z_hicnt,SD_in,shift_px,lo_carry;
UL  encnt,udown,load,reset;
UL  hicnt_out,hicnt,tri_z_SD,tri_z_hicnt;

enum SHIFTP  { SHIFT_00=0, SHIFT_30=1, SHIFT_60=2 };

int  main(void);
void logic(void);
UL   bin_updwn_cntr(UL,UL,UL,UL,UL *);

UL   address,addrtop,rdata;
int  addb,datb;

/* main ******************************************************** FUNCTION */
int main()
{ time(&TIMESTAMP);
. hkeep(s[0],s[1],s[2],s[3],&addrtop,&addb,&datb);
.
. for (address=0; address<=addrtop; address++)
                /* address bits  "5432109876543210"  */
. { define_input_vector(address, "--111-----------", &cf_hicnt         );
. . define_input_vector(address, "-----111--------", &cf_tri_z_hicnt   );
. . define_input_vector(address, "--------1-------", &SD_in            );
. . define_input_vector(address, "---------11-----", &shift_px         );
. . define_input_vector(address, "-----------1----", &lo_carry         );
. . define_input_vector(address, "------------1---", &encnt            );
. . define_input_vector(address, "-------------1--", &udown            );
. . define_input_vector(address, "--------------1-", &load             );
. . define_input_vector(address, "---------------1", &reset            );
. . logic(); rdata=(UL)0;
. .
. .             /*    data bits  "5432109876543210"  */
. . define_output_vector(&rdata, "------111-------", &hicnt_out        );
. . define_output_vector(&rdata, "---------111----", &hicnt            );
```

1                                                              ptf_hcnt.c

E:\crm\crm2\pal\pa  ~~patent~~ t\ptf_hcnt.c

```
. . define_output_vector(&rdata, "------------o---", &tri_z_SD      );
. . define_output_vector(&rdata, "-------------111", &tri_z_hicnt   );
. . store_rdata(address,rdata);
. }
. write_rdata_cleanup(); return(0);
}

/* logic ****************************************************** FUNCTION */
void logic()
{ UL hicnt_MAX;

. hicnt_MAX = 6; /* counting seq: 0,1,2,3,4,5,0 ... */

. /* tri_stated outputs */
. tri_z_SD    = SD_in;
. tri_z_hicnt = cf_hicnt;

. /* change invalid states to valid states */
. if (cf_hicnt>=hicnt_MAX) { cf_hicnt &= 3; }

. /* For testing phase step response,
       shift PLL clock (FCO output after div-2) by 0, 30 & 60 degrees
   */
. hicnt_out = cf_hicnt;
. switch ((enum SHIFTP)shift_px)
. { default: /* fall through,              shift 30 degs after div-2 */
. . case SHIFT_30: hicnt_out += 1; break; /* shift 30 degs after div-2 */
. . case SHIFT_60: hicnt_out += 2; break; /* shift 60 degs after div-2 */
. . case SHIFT_00: hicnt_out += 0; break; /* no shift                  */
. }
. /* wrap arround */
. if (hicnt_out >= hicnt_MAX) { hicnt_out -= hicnt_MAX; }

. /* upcount or downcount */
. hicnt = cf_hicnt;
. bin_updwn_cntr(hicnt_MAX,udown,encnt,lo_carry,&hicnt);

. /* clear or load counter */
. if (load) {
. . hicnt = cf_tri_z_hicnt; /* read from input port */
. .
. } else if (reset) {
. . hicnt = 0;
. }
. return;
}

/* bin_updwn_cntr ************************************************ FUNCTION */
UL bin_updwn_cntr(maxcntpl,up_down,en__P,en__T,  cQs)
```

E:\crm\crm2\pal\patent\ptf_ldac.c

```c
#include "romwcsc.h"

char *s[]={ "ev / ptf_ldac",
        . "Pal=GAL22CV10-10L(Nat), Addbit=12, Datbit=10",
        . "rev 0 / Oct 12,1994",
        . "rev 0 / Oct 12,1994" };

/* eqnfile pin assignment: i)nput, r)egistered op, c)ombinatorial op
   {"  1   2   3   4   5   6   7   8   9  10  11  12 "}
   {"  ck  i9  i8  i7  i6  i5  i4  i3  i2  i1  i0 gnd "}
   {" 13  14  15  16  17  18  19  20  21  22  23  24 "}
   {" i10  r0  r1  c2  r3  r4  r5  r6  r7  r8  r9 vcc "}
*/

UL  cf_pdmall,cf_pdmacc,disable_pdm,hicnt,locnt_h,locnt_l,reset;
UL  DAC1_pdm,DAC2_pdm,DAC3_pdm,pdmall,pdmacc,dummy;

int   main(void);
void  logic(void);
UL    get_pdm(UL,UL,UL);
int   chk_valid_get_3phase(UL,UL *,UL *,UL *);

UL   address,addrtop,rdata;
int  addb,datb;

/* main ********************************************************* FUNCTION */
int main()
{ time(&TIMESTAMP);
. hkeep(s[0],s[1],s[2],s[3],&addrtop,&addb,&datb);

. for (address=0; address<=addrtop; address++)
                 /* address bits   "5432109876543210"   */
.  { define_input_vector(address, "----1-----------", &cf_pdmall     );
. .   define_input_vector(address, "-----11---------", &cf_pdmacc     );
. .   define_input_vector(address, "-------1--------", &disable_pdm   );
. .   define_input_vector(address, "--------111-----", &hicnt         );
. .   define_input_vector(address, "-----------11---", &locnt_h       );
. .   define_input_vector(address, "-------------11-", &locnt_l       );
. .   define_input_vector(address, "---------------1", &reset         );
. .   logic(); rdata=(UL)0;
. .
. .              /*   data bits   "5432109876543210"   */
. .   define_output_vector(&rdata, "------1111------", &dummy         );
. .   define_output_vector(&rdata, "----------o-----", &DAC1_pdm      );
. .   define_output_vector(&rdata, "-----------o----", &DAC2_pdm      );
. .   define_output_vector(&rdata, "------------o---", &DAC3_pdm      );
. .   define_output_vector(&rdata, "--------------1-", &pdmall        );
. .   define_output_vector(&rdata, "--------------11", &pdmacc        );
. .   store_rdata(address,rdata);
.  }
.  write_rdata_cleanup(); return(0);
}
```

E:\crm\crm2\pal\patent\ptf_1dac.c

```
/* logic ****************************************************** FUNCTION */
void logic()
{ UL   hicnt3,hicnt2,hicnt1,PDM_MAX;
. int valid;
.
. dummy=0;
.
. valid=chk_valid_get_3phase(hicnt,&hicnt1,&hicnt2,&hicnt3);
. if (valid==0) {
. . DAC1_pdm = DAC2_pdm = DAC3_pdm = dcare("-");   /* invalid */
. . pdmall   = dcare("-");
. . pdmacc   = dcare("--");
. .
. } else {  /* valid hicnt */
. . pdmacc   = cf_pdmacc + locnt_l;   /* pdm adder */
. . PDM_MAX  = (UL)3;                 /* pdm full scale */
. .
. . if (pdmacc < PDM_MAX) {
. . . pdmall = 0;
. . } else {
. . . pdmacc -= PDM_MAX;
. . . pdmall = 1;
. . }
. .
. . DAC1_pdm = get_pdm(hicnt1,locnt_h,cf_pdmall);
. . DAC2_pdm = get_pdm(hicnt2,locnt_h,cf_pdmall);
. . DAC3_pdm = get_pdm(hicnt3,locnt_h,cf_pdmall);
. }
.
. if (disable_pdm)
. { DAC3_pdm = 0;
. . DAC2_pdm = 0;
. . DAC1_pdm = 0;
. }
. if (reset)
. { DAC1_pdm = 0;
. . DAC2_pdm = 0;
. . DAC3_pdm = 0;
. . pdmacc   = 0;
. }
. return;
}

/* get_pdm ****************************************************** FUNCTION */
UL get_pdm(phse,phse_lo,pdm_in)
UL phse,phse_lo,pdm_in;
{ UL   phse_h,phsecnt,pdm;
.
. /* find phsecnt */
. phse_h = phse;
. if (phse >= 3) { phse_h -= 3; }
. phsecnt = (phse_h * (UL)4) | phse_lo;   /* 0 to 11 */
.
```

2                                                                    ptf_1dac.c

E:\crm\crm2\pal\patent\ptf_ldac.c

```c
  /* decode phsecnt */
  switch (phsecnt)
  { default: pdm = pdm_in; break;

case 11: pdm = 1;      break;
    case 10: pdm = 1;      break;

case  1: pdm = 0;      break;
    case  0: pdm = 0;      break;
  } if (phse >= 3) { pdm = pdm ^ (UL)1; }
  return(pdm);
}

/* chk_valid_get_3phase ***************************************** FUNCTION */
int chk_valid_get_3phase(phsein,phse1,phse2,phse3)
UL  phsein,*phse1,*phse2,*phse3;
{ int valid;
  UL phin;

switch (phsein) /* phsein counting seq: 0,1,2,3,4,5,0,... */
  { default: phin=0; valid=0; break;
    case 0:  phin=0; valid=1; break;
    case 1:  phin=1; valid=1; break;
    case 2:  phin=2; valid=1; break;
    case 3:  phin=3; valid=1; break;
    case 4:  phin=4; valid=1; break;
    case 5:  phin=5; valid=1; break;
    case 6:  phin=0; valid=0; break;
    case 7:  phin=0; valid=0; break;
  } if (valid)
  { *phse1 = phin + 0;                /* add offset to phse1 */
    if (*phse1 >= 6) { *phse1-=6; }   /* wrap arround        */

*phse2 = phin + 2;                /* add offset to phse2 */
    if (*phse2 >= 6) { *phse2-=6; }   /* wrap arround        */

*phse3 = phin + 4;                /* add offset to phse3 */
    if (*phse3 >= 6) { *phse3-=6; }   /* wrap arround        */
  }
  return(valid);
}
```

E:\crm\crm2\pal\patent\ptf_hdac.c

```c
#include "romwcsc.h"

char *s[]={ "ev / ptf_hdac",
          . "Pal=GAL22CV10-10L(Nat), Addbit=6, Datbit=10",
          . "rev 0 / Oct 12,1994",
          . "rev 0 / Oct 12,1994" };

/* eqnfile phin assignment: i)nput, r)egistered op, c)ombinatorial op
    {"  1   2   3   4   5   6   7   8   9  10  11  12 "}
    {"  ck  i9  i8  i7  i6  i5  i4  i3  i2  i1  i0 gnd "}
    {" 13  14  15  16  17  18  19  20  21  22  23  24 "}
    {" i10  r0  r1  r2  r3  r4  r5  r6  r7  r8  r9 vcc "}
*/

UL  hicnt,locnt_h,reset,dummy;
UL  DAC3_4,DAC3_2,DAC3_1;
UL  DAC2_4,DAC2_2,DAC2_1;
UL  DAC1_4,DAC1_2,DAC1_1;

int  main(void);
void logic(void);
void decode_dac_bits(UL,UL,UL *,UL *,UL *);
int  chk_valid_get_3phase(UL,UL *,UL *,UL *);

UL   address,addrtop,rdata;
int  addb,datb;

/* main ************************************************** FUNCTION */
int main()
{ time(&TIMESTAMP);
. hkeep(s[0],s[1],s[2],s[3],&addrtop,&addb,&datb);
.
. for (address=0; address<=addrtop; address++)
                 /* address bits  "5432109876543210" */
. { define_input_vector(address, "----------111---", &hicnt        );
. . define_input_vector(address, "-------------11-", &locnt_h      );
. . define_input_vector(address, "---------------1", &reset        );
. . logic(); rdata=(UL)0;

. .             /*   data bits   "5432109876543210" */
. . define_output_vector(&rdata, "------o---------", &DAC1_4       );
. . define_output_vector(&rdata, "-------o--------", &DAC1_2       );
. . define_output_vector(&rdata, "--------o-------", &DAC1_1       );
. . define_output_vector(&rdata, "---------o------", &DAC2_4       );
. . define_output_vector(&rdata, "----------o-----", &DAC2_2       );
. . define_output_vector(&rdata, "-----------o----", &DAC2_1       );
. . define_output_vector(&rdata, "------------o---", &DAC3_1       );
. . define_output_vector(&rdata, "-------------o--", &DAC3_2       );
. . define_output_vector(&rdata, "--------------o-", &DAC3_4       );
. . define_output_vector(&rdata, "---------------1", &dummy        );
. . store_rdata(address,rdata);
. }
. write_rdata_cleanup(); return(0);
}
```

E:\crm\crm2\pal\patent\ptf_hdac.c

```c
/* logic ******************************************************* FUNCTION */
void logic()
{ UL hicnt1,hicnt2,hicnt3;
  int valid;

dummy = 0;

if (reset)
  { hicnt = locnt_h = 0;
  } valid=chk_valid_get_3phase(hicnt,&hicnt1,&hicnt2,&hicnt3);
  if ((valid==0)&&(reset==0)) {
    DAC1_4 = DAC1_2 = DAC1_1 = dcare("-"); /* invalid */
    DAC2_4 = DAC2_2 = DAC2_1 = dcare("-");
    DAC3_4 = DAC3_2 = DAC3_1 = dcare("-");

} else { /* valid hicnt */
    decode_dac_bits(hicnt1,locnt_h,&DAC1_4,&DAC1_2,&DAC1_1);
    decode_dac_bits(hicnt2,locnt_h,&DAC2_4,&DAC2_2,&DAC2_1);
    decode_dac_bits(hicnt3,locnt_h,&DAC3_4,&DAC3_2,&DAC3_1);
  } return;
}

/* decode_dac_bits ********************************************* FUNCTION */
void decode_dac_bits(phse,phse_lo,dac4,dac2,dac1)
UL phse,phse_lo,*dac4,*dac2,*dac1;
{ UL  phse_h,phsecnt;
  int d4,d2,d1,sum;

/* find phsecnt */
  phse_h = phse;
  if (phse >= 3) { phse_h -= 3; }
  phsecnt = (phse_h * (UL)4) | phse_lo;  /* 0 to 11 */

/* decode phsecnt */
  d4=d2=d1=sum=0;
  switch (phsecnt)
  { default:  err_exitn("Error1 in decode_dac_bits()"); break;
    case 11:  d4=4; d2=2; d1=1; sum=7; break;
    case 10:  d4=4; d2=2; d1=1; sum=7; break;
    case  9:  d4=4; d2=2; d1=1; sum=7; break;
    case  8:  d4=4; d2=2; d1=0; sum=6; break;

case  7:  d4=4; d2=0; d1=1; sum=5; break;
    case  6:  d4=4; d2=0; d1=0; sum=4; break;
    case  5:  d4=0; d2=2; d1=1; sum=3; break;
    case  4:  d4=0; d2=2; d1=0; sum=2; break;

case  3:  d4=0; d2=0; d1=1; sum=1; break;
```

E:\crm\crm2\pal\patent\ptf_hdac.c

```
. . case  2:   d4=0; d2=0; d1=0; sum=0; break;
. . case  1:   d4=0; d2=0; d1=0; sum=0; break;
. . case  0:   d4=0; d2=0; d1=0; sum=0; break;
. }
.
.
. /* error traps */
. if ((d4+d2+d1) != sum)
. { err_exitn("Error2 in decode_dac_bits()");
. }
.
. /* find dac bits */
. *dac4 = *dac2 = *dac1 = 0;
. if (d4) { *dac4 = 1; }
. if (d2) { *dac2 = 1; }
. if (d1) { *dac1 = 1; }
.
. /* code 2nd half of the cycle by inverting all bits */
. if (phse >= 3)
. { *dac4 = *dac4 ^ (UL)1;
. . *dac2 = *dac2 ^ (UL)1;
. . *dac1 = *dac1 ^ (UL)1;
. }
. return;
}

/* chk_valid_get_3phase ***************************************** FUNCTION */
int chk_valid_get_3phase(phsein,phse1,phse2,phse3)
UL  phsein,*phse1,*phse2,*phse3;
{ int valid;
. UL phin;

. switch (phsein) /* phsein counting seq: 0,1,2,3,4,5,0,... */
. { default: phin=0; valid=0; break;
. . case 0:  phin=0; valid=1; break;
. . case 1:  phin=1; valid=1; break;
. . case 2:  phin=2; valid=1; break;
. . case 3:  phin=3; valid=1; break;
. . case 4:  phin=4; valid=1; break;
. . case 5:  phin=5; valid=1; break;
. . case 6:  phin=0; valid=0; break;
. . case 7:  phin=0; valid=0; break;
. }
.
. if (valid)
. { *phse1 = phin + 0;                /* add offset to phse1 */
. . if (*phse1 >= 6) { *phse1-=6; }   /* wrap arround         */
. .
. . *phse2 = phin + 2;                /* add offset to phse2 */
. . if (*phse2 >= 6) { *phse2-=6; }   /* wrap arround         */
. .
. . *phse3 = phin + 4;                /* add offset to phse3 */
. . if (*phse3 >= 6) { *phse3-=6; }   /* wrap arround         */
```

E:\crm\crm2\pal\patent\ptf_hcnt.c

```
UL maxcntp1,up_down,en__P,en__T, *cQs;
{ UL cnt_max,count,carry,over,under;

. cnt_max = maxcntp1 - 1;
. count = *cQs;

. over  = (((count >= cnt_max)&&(up_down==1)) ? (1) : (0));
. under = (((count == 0)       &&(up_down==0)) ? (1) : (0));
. if (!en__T) {
. . carry=0;    /* en__T cuts off carry */
. } else {
. . carry = (over | under);
. }

. if ((en__T)&&(en__P))
. { if (up_down) {  /* 1=up */
. . . *cQs = ((over)  ?       (0) : (count+1));
. . } else {        /* 0=down */
. . . *cQs = ((under) ? (cnt_max) : (count-1));
. . }
. }
. return(carry);
}
``` ptf_hcnt.c

E:\crm\crm2\pal\patent\ptf_hdac.c

```
  }
  return(valid);
}
```

What is claimed is:

1. A trapezoidal waveform synthesizer that converts a digital phase error signal that indicates positive and negative phase errors into a plurality of phase-separated trapezoidal waveforms, the trapezoidal waveform synthesizer comprising:

an up/down counter that counts the positive and negative phase errors and generates a multi-bit, parallel digital counter output signal that indicates a cumulative current value of the phase errors, the counter output signal including a least significant bit (LSB) portion and a most significant bit (MSB) portion;

an upper pulse density modulation (PDM) circuit that converts the MSB portion of the counter output signal and a portion of the LSB portion of the counter output signal to provide a plurality of sets of serially-weighted multi-bit output signals;

a lower pulse density modulation (PDM) circuit that converts the MSB portion of the counter output signal and the LSB portion of the counter output signal to a plurality of serially-weighted single-bit output signals; and a plurality of RC circuits, each RC circuit being connected to receive one of the plurality of single-bit output signals and a corresponding one of the sets of multi-bit output signals and to provide a corresponding analog trapezoidal waveform, whereby the waveform synthesizer provides a plurality of phase-separated analog trapezoidal waveforms.

2. A trapezoidal waveform synthesizer that converts a digital phase error signal that indicates positive an negative phase errors into three phase-separated trapezoidal waveforms, the trapezoidal waveform synthesizer comprising:

an up/down counter that counts the positive and negative phase errors and generates a 7-bit, parallel digital counter output signal that indicates a cumulative current value of the phase errors, the counter signal including a 4-bit least significant bit (LSB) portion and a 3-bit most significant bit (MSB) portion;

an upper pulse density modulation (PDM) circuit that combines the MSB portion of the counter output signal and the two most significant bits of the LSB portion of the counter output signal to provide three sets of serially-weighted 3-bit output signals;

a lower PDM circuit that converts the counter output signal to three serially-weighted single-bit output signals; and three RC circuits, each RC circuit adapted to receive one of the 3-bit outputs and a corresponding one of the single-bit outputs and to generate a corresponding analog trapezoidal waveform such that the trapezoidal waveform synthesizer generates three phase-separated analog trapezoidal waveforms.

3. A trapezoidal waveform synthesizer as in claim 2 and wherein the trapezoidal waveforms are phase-separated by 120°.

4. A method of converting a digital phase error signal that indicates positive and negative phase errors into a plurality of phase-separated trapezoidal waveforms, the method comprising:

counting the positive and negative phase errors to generate a multi-bit parallel count signal that indicates a cumulative current value of the phase errors, the count signal including a least significant bit (LSB) portion and a most significant bit (MSB) portion;

utilizing pulse density modulation to convert the MSB portion of the count signal and a portion of the LSB portion of the count signal to a plurality of sets of serially-weighted multi-bit output signals;

converting the count signal to a plurality of serially-weighted single-bit output signals;

combining each of the plurality of sets of multi-bit output signals with a corresponding one of the plurality of single-bit output signals to serve as inputs to a corresponding RC circuit to provide a corresponding analog trapezoidal waveform whereby a plurality of phase-separated analog trapezoidal waveforms are provided.

* * * * *